(12) United States Patent
Konishi et al.

(10) Patent No.: US 7,873,254 B2
(45) Date of Patent: Jan. 18, 2011

(54) MOUNTING MEMBER FOR FIXEDLY HOLDING CYLINDRICAL MOUNTED PART ON PRINTED WIRING BOARD

(75) Inventors: Ikuo Konishi, Kawasaki (JP); Hideaki Takahashi, Kawasaki (JP); Kiyoshi Iwasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 130 days.

(21) Appl. No.: 11/410,090

(22) Filed: Apr. 25, 2006

(65) Prior Publication Data

US 2007/0145199 A1    Jun. 28, 2007

(30) Foreign Application Priority Data

Dec. 28, 2005    (JP) .............................. 2005-379152

(51) Int. Cl.
G02B 6/00 (2006.01)

(52) U.S. Cl. ....................................... 385/137; 385/134
(58) Field of Classification Search ........................ None
See application file for complete search history.

(56) References Cited

U.S. PATENT DOCUMENTS

| 5,805,758 | A | 9/1998 | Kim | |
|---|---|---|---|---|
| 6,738,556 | B1 * | 5/2004 | Mueller et al. | 385/137 |
| 6,850,687 | B2 * | 2/2005 | Lavoie | 385/137 |
| 2007/0053646 | A1 * | 3/2007 | Kendricks | 385/136 |

FOREIGN PATENT DOCUMENTS

| JP | 2951280 | 7/1999 |
|---|---|---|
| JP | 2000-35516 | 2/2000 |
| JP | 2001-042158 | 2/2001 |
| JP | 2002-281628 | 9/2002 |
| JP | 2003-29051 | 1/2003 |
| JP | 2005-516237 | 6/2005 |
| WO | WO 03/062890 A2 | 7/2003 |

OTHER PUBLICATIONS

Notice of Reasons for Rejection mailed Aug. 10, 2010 from the Japanese Patent Office with English translation (5 pages).

* cited by examiner

*Primary Examiner*—Tina M Wong
(74) *Attorney, Agent, or Firm*—Kratz, Quintos & Hanson, LLP

(57) ABSTRACT

A mounting member has a tube, and a plurality of clamps. The clamps hold the tube or outer portions on both sides of the tube. Therefore, the external load on the mounted part can be minimized while at the same time the mounted part is easily held fixedly on a board such as a printed wiring board.

22 Claims, 7 Drawing Sheets

MOUNTING MEMBER FOR FIXEDLY HOLDING CYLINDRICAL MOUNTED PART ON PRINTED WIRING BOARD

CROSS REFERENCE TO RELATED APPLICATION

This application is based upon, and claims the benefit of priority from, the prior Japanese Patent Application No. 2005-379152, filed on Dec. 28, 2005, the entire contents of which are incorporated herein by reference.

BACKGROUND OF THE INVENTION

1. Field of the Invention

The present invention relates to a mounting member, a device, a device fabrication method and a method of a mounting a member to be mounted (hereinafter referred to as a mounted part). More particularly, the present invention relates to a technique for fixedly holding a cylindrical mounted part on a printed wiring board.

2. Description of the Related Art

In the conventional process of assembling a printed wiring board, a cylindrical part (cylindrical member constituting a mounted part) having a fiber with a connector is fixedly held on a printed wiring board by various methods (for examples, the methods described later with reference to FIGS. 1 to 3). The cylindrical member having a fiber with a connector includes an optical splitter for splitting one optical fiber input into two optical fiber outputs or an optical coupler for producing one optical fiber output by combining two optical fiber inputs.

The present invention is not limited to the cylindrical members such as the optical splitter and the optical coupler, but is widely applicable to various other cylindrical members and elongate members having various shapes of cross sections such as rectangle which are fixedly held on various boards (object members) including a printed circuit board.

Japanese Unexamined Patent Publication (Kokai) No. 2003-029051, for example, proposes a band-shaped protective member of a flexible material for the optical fiber core to reduce the side pressure exerted on the optical fiber core or the bending deformation with a small radius of curvature due to external factors while at the same time suppressing the breakage of the resin layer, wherein a core fitting groove with the optical fiber core adapted to be fitted therein is formed in longitudinal direction.

Further, Japanese Patent Publication (Kohyo) No. 2005-516237 (corresponding to International Publication No. WO2003/062890) proposes an aperture sealing device for a projected fiber guide tube with an optical fiber cable inserted therein, in which a part of an elastic sleeve formed of thermoplastic elastomer is sealed and clamped by a clamp member.

In addition, Japanese Unexamined Patent Publication (Kokai) No. 2000-035516 proposes an optical fiber clamp simple in structure, high in operability for wiring optical fibers and capable of holding a plurality of optical fibers, in which an optical fiber holder is formed of an elastic member, a slit is cut to at least a predetermined depth across the holder and a mounting portion is formed on the frame of the holder.

Further, Japanese Patent No. 2951280 (corresponding to Japanese Unexamined Patent Publication (Kokai) No. 9-211254; U.S. Pat. No. 5,805,758) proposes a protective support member for a connector usable for both fusion connection and mechanical connection including, at the left and right ends thereof, an inner fitting portion where a mechanical splicer can be mounted by mechanical connection and an outer fitting portion where a heat-shrinkable tube can be mounted by fusion connection, wherein both the inner and outer fitting portions are formed between erected guard hooks with a guide surface for mounting the fiber.

In addition, Japanese Unexamined Patent Publication (Kokai) No. 2002-281628, on the other hand, proposes a configuration utilizing a U-shaped groove in which a slot, with a cable mounted therein, is formed in longitudinal direction for the main purpose of reducing the cable laying cost.

The prior art and its associated problems will be described later with reference to the accompanying drawings.

SUMMARY OF THE INVENTION

An object of the present invention is to minimize the external load on a mounted part while at the same time facilitating the job of fixedly holding the mounted part on a board such as a printed wiring board.

According to the present invention, there is provided a mounting member comprising a tube; and a plurality of clamps holding the tube or outer portions on both sides of the tube.

According to the present invention, there is also provided a mounting member comprising a tube with a mounted part inserted therein; and a plurality of clamps fixedly holding the tube with the mounted part inserted therein.

Further, according to the present invention, there is provided a device comprising a mounted part; a tube with the mounted part inserted therein; and a plurality of clamps mounted on an object member fixedly holding the tube with the mounted part inserted therein on the object member.

According to the present invention, there is provided a device comprising a cylindrical member with an optical fiber extending from each end thereof; a tube with the cylindrical member inserted therein; and a plurality of clamps mounted on an object member to fixedly hold the tube on the object member with the cylindrical member inserted therein.

Further, according to the present invention, there is also provided a method of fabricating the device, comprising forming a slit on a tube; inserting a mounted part into the tube through the slit; and fixedly holding, by clamps, the tube with the mounted part inserted therein.

In addition, according to the present invention, there is provided a method of mounting a mounted part, comprising preparing a tube formed with a slit; fitting the tube on an outside of the mounted part through the slit of the tube; and fixedly holding on an object member the mounted part, with the tube mounted thereon, by clamps mounted on the object member.

The tube may have a slit and may be fitted on an outside of a mounted part through the slit. The tube may be adherent or flexible, and an inner diameter of the tube may be equal to, or smaller than, an outer diameter of the mounted part.

The clamps may hold portions of the mounted part on two outer sides of the tube fitted on the outside of the mounted part. The clamps may hold the tube fitted on the outside of the mounted part.

The slit may have a portion formed on the tube in parallel to, or linearly at a predetermined angle with, the length of the tube. The slit may include a hook-like portion.

The tube may be formed of silicon rubber. The mounted part may be a cylindrical member, and the clamps may be used to mount the cylindrical member on a printed wiring board. The mounted part may be a selected one of an optical coupler and an optical splitter including an optical fiber having an optical connector at each end thereof.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before describing in detail the preferred embodiments of the present invention, the conventional mounting members and their underlying problems will be explained with reference to FIGS. 1 to 3.

Figure 1:
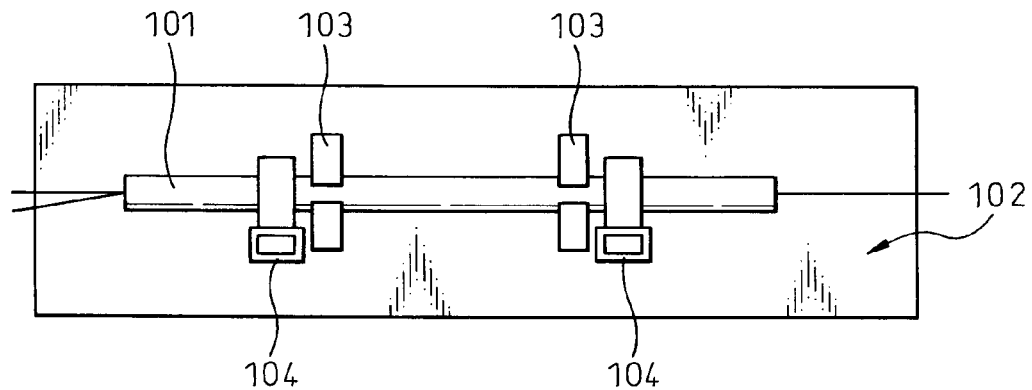
FIG. 1 is a diagram for explaining an example of a conventional mounting member for fixedly holding a cylindrical member on a printed wiring board.
Figure 2:
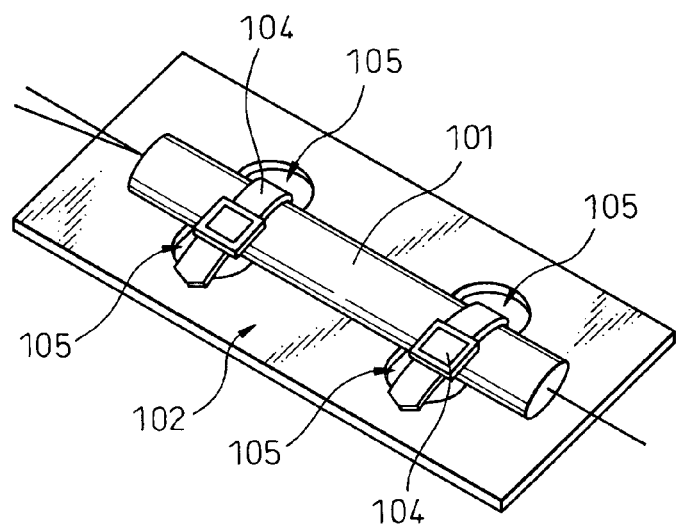
FIG. 2 is a diagram for explaining another example of the conventional mounting member for fixedly holding a cylindrical member on a printed wiring board.
Figure 3:
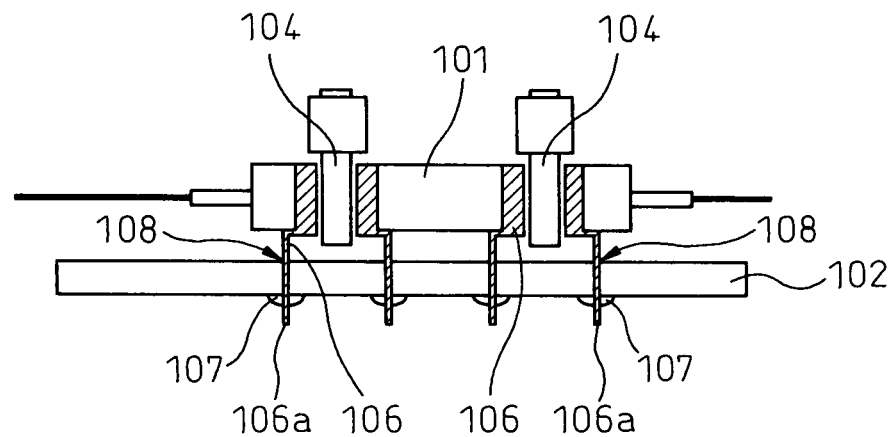
FIG. 3 is a diagram for explaining still another example of the conventional mounting member for fixedly holding a cylindrical member on a printed wiring board.

FIGS. 1 to 3 are diagrams for explaining examples of conventional mounting members for fixedly holding a cylindrical member on a printed wiring board.

According to the prior art, as shown in FIG. 1, a cylindrical member 101 of an optical splitter or the like is fixedly held on a printed wiring board 102 in such a manner that the cylindrical member 101 is held by two clamps 103 mounted on the printed wiring board 102 and further fastened by tie wraps 104 on the two outer sides of the two clamps 103 to prevent the cylindrical members 101 from coming off from the clamps 103. In the fastening process using the tie wraps 104, the gap between each clamp 103 and the corresponding tie wrap 104 is minimized.

As an alternative, as shown in FIG. 2, a pair of through holes 105 are formed on each of the parts of the printed wiring board 102 corresponding to the two sides of the cylindrical member 101, and using the tie wraps 104 in these through holes 105, the two sides of the cylindrical member 101 are directly fastened to fixedly hold the cylindrical member 101 on the printed wiring board 102.

As another method, as shown in FIG. 3, a plurality of through holes 108 (for example, four through holes for fittings 106) are formed on the printed wiring board 102, and the forward ends of the pins 106a of the fittings 106 inserted into the through holes are soldered to fix the fittings 106 on the printed wiring board 102. Further, the cylindrical member 101 is arranged with respect to the fittings 106, on which the cylindrical member 101 is fastened through the tie wraps 104, thereby to fixedly hold the cylindrical member 101 on the printed wiring board 102. While fastening the tie wraps 104, the fittings 106 are bent, for example, to adjust the gap between the cylindrical member 101 and the fittings 106.

As described above, in the conventional process of fixedly holding the cylindrical member 101, such as an optical splitter, on the printed wiring board 102, the cylindrical member 101 is fastened mainly by the tie wraps 104.

Specifically, the conventional methods shown in FIGS. 1 to 3 include the step of fastening the cylindrical member 101 with the tie wraps 104. This fastening step requires a fastening force sufficient to fix the cylindrical member 101 without exerting an excessive load on the cylindrical member 101. Once an excessive fastening force is applied to the cylindrical member 101 in the fastening step using the tie wraps 104, the cylindrical member is often deformed or broken. This also requires a delicate adjustment of the fastening force of the tie wraps and adversely affects the job efficiency, while at the same time tending to cause an error due to variations of the fastening force from one worker to another.

Also, the method described with reference to FIG. 1 poses the problem that a looseness may occur between the clamps 103 and the tie wraps 104.

Further, in the method described with reference to FIG. 2, the through holes 105 are formed directly on the printed wiring board 102, for example, and therefore, the parts mounting area is reduced, which in turn reduces the design freedom of the wiring pattern of the printed wiring board.

Also, in the method described with reference to FIG. 3, the tie wraps 104, after being inserted from the part-side surface (upper surface) and returned to the part-side surface from the soldered surface (lower surface), are fastened on the cylindrical member 101. Thus, the working efficiency is low. Also, in view of the fact that both the cylindrical member (part) 101 and the fittings 106 are fastened by the tie wraps on the part-side surface, the dimensional difference between the fittings and the part makes it necessary to adjust the fittings at the time of fastening, thereby further reducing the working efficiency.

A mounting member, a device, a device fabrication method and a method of mounting a part to be mounted (hereinafter referred to as the mounted part) are explained in detail below with reference to the accompanying drawings.

Figure 4:
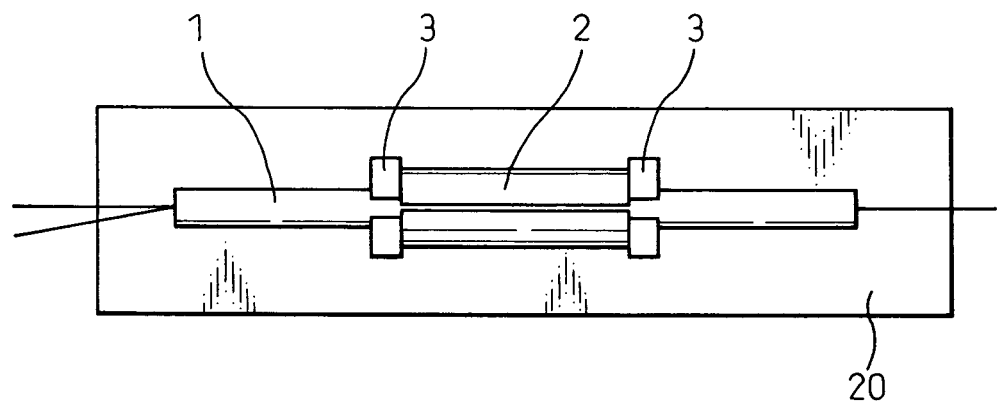
FIG. 4 is a diagram for explaining an embodiment of a mounting member for fixedly holding a cylindrical member on a printed wiring board according to the present invention.

FIG. 4 is a diagram for explaining an embodiment of a mounting member for fixing a cylindrical member on a printed wiring board according to the present invention. In FIG. 4, reference numeral 1 designates a cylindrical member (mounted part), numeral 2 a tube, numeral 3 clamps and numeral 20 a printed wiring board (object member). The mounting member according to the invention includes the tube 2 and the clamps 3.

The cylindrical member 1 includes, but is not limited to, for example, an optical coupler or an optical splitter having optical fibers at the ends thereof.

The tube 2 is formed of silicon rubber, for example, and has an inner diameter equal to or slightly smaller than the outer diameter of the cylindrical member 1, so that the cylindrical member 1 fitted in the tube 2 can be held by the adhesion of the inner surface of the tube 2 or the restitutive force (elastic force) of the tube 2.

Specifically, by forming the tube 2 of silicon rubber (a silicon rubber tube) having an inner diameter equal to the outer diameter of the cylindrical member 1, for example, the external force to fasten the cylindrical member 1 can be maintained at substantially zero by the snugly fitting adhesion of the silicon rubber tube. The tube 2 is required to have the adhesion or flexibility sufficient to hold the cylindrical member firmly when fitted on the latter, and can be formed of natural rubber or any of other various materials. Also, the silicon rubber or the like forming the tube 2 functions as a buffer, for example, against impacts on the cylindrical member 1.

The gap between the two clamps 3 is slightly larger than the length of the tube 2. According to this embodiment, a small play, which may occur due to the fact that the distance between the two clamps is slightly larger than the length of the tube 2, is accommodated by the elasticity (flexibility) of the material, such as silicon rubber, of the tube 2.

In the aforementioned case, if end of the cylindrical member 1 is formed with only the optical fiber or the like and can be passed as it is through the tube 2, as described later, it is possible to insert the cylindrical member 1 directly into the tube 2 without forming any slit on the tube 2. In the case where the cylindrical member 1 is inserted into the tube 2 directly, water is dripped, for example, on the outside of the cylindrical member 1 or on the inside of the tube 2 thereby to reduce the adhesion coefficient (friction coefficient) between the two. After that, the moisture is evaporated and the cylindrical member 1 firmly held in the tube 2.

FIGS. 5A to 5D are diagrams for explaining an example of a method of fabricating the device according to the invention.

Figure 5A:
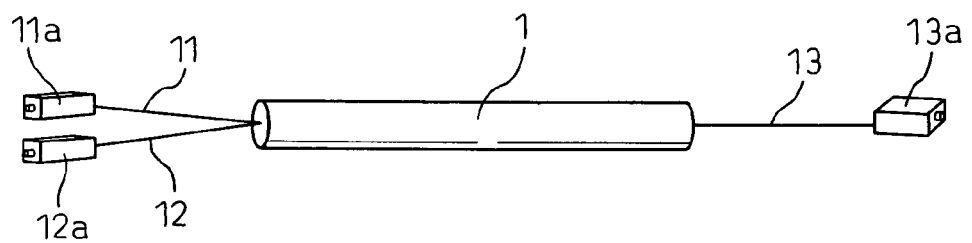
FIGS. 5A, 5B, 5C and 5D are diagrams for explaining an example of a device fabrication method according to the invention.

An optical coupler as an example of the cylindrical member 1 making up a mounted part is shown in FIG. 5A. Two optical fibers 11, 12 with optical connectors 11a, 12a for inputting optical signals are arranged at an end of an optical coupler 1. At the other end of the optical coupler 1, an optical fiber 13 having an optical connector 13a for the two combined optical input signals is arranged for outputting the optical signal.

Figure 5B:
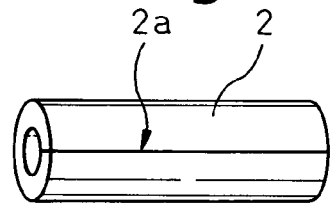

FIG. 5B shows an example of the tube 2. The tube 2 is formed with a slit 2a in parallel to the length of the tube. The tube 2 is formed of silicon rubber or the like material having flexibility (adhesion). The inner diameter of the tube 2 is equal to or slightly smaller than the outer diameter of the cylindrical member 1, so that the cylindrical member 1 fitted in the tube 2 can be held by the adhesion of the inner surface of the tube 2 or the restitutive force (elastic force) of the tube 2.

The provision of the slit 2a on the tube (a silicon rubber tube) 2 reduces the force to grip the cylindrical member 1. By selecting such a thickness as to increase the self-resituitive force (elastic force), however, the cylindrical member 1 can be sufficiently held with the adhesion of silicon. Specifically, the tube 2 formed of silicon rubber can be about one half as thick as the inner diameter thereof. The optimum thickness of the tube 2 can of course be selected appropriately taking various factors such as the length and the material of the tube and the surface material and the weight of the part involved into consideration.

Figure 5C:
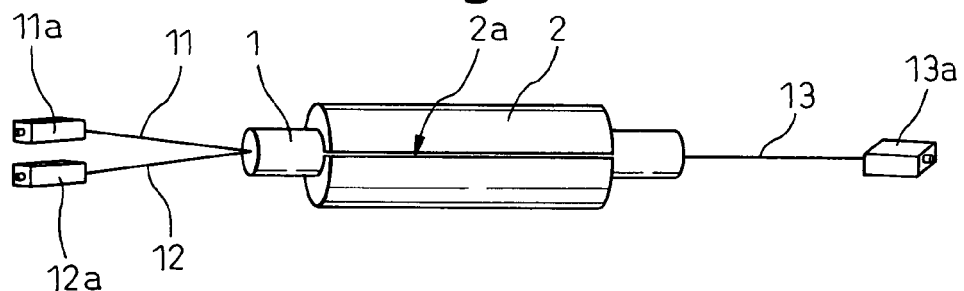

FIG. 5C shows the state in which the tube 2 is fitted on the outside of the cylindrical member 1 through the slit 2a. As described above, the inner diameter of the tube 2 is slightly smaller than the outer diameter of the cylindrical member 1. Therefore, the cylindrical member 1 can be held firmly by the restitutive force of the tube 2 or the adhesion of the inner surface of the tube 2 with substantially no external force (an external force causing no deformation or breakage of the cylindrical member 1).

Figure 5D:
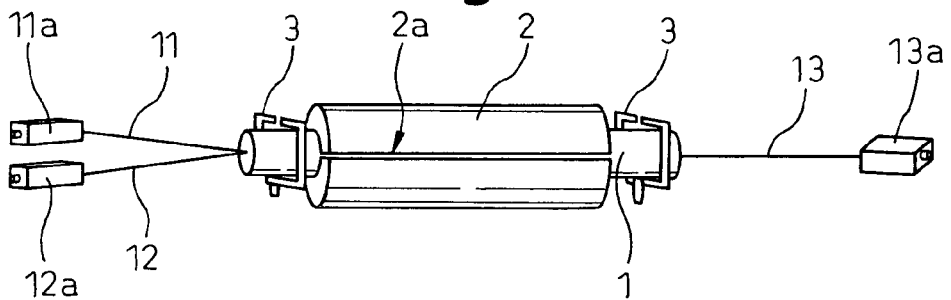

In FIG. 5D, the two clamps 3 hold the two outer side portions of the tube 2 (the portions of the cylindrical member 1 corresponding to the two sides of the tube 2) into which the cylindrical member 1 is inserted. As an alternative, the tube 2 with the cylindrical member 1 inserted therein can be held. The clamps 3 are fixed on any of various boards including a printed wiring board and a metal plate.

As described above, the cylindrical member 1 making up an optical coupler having the optical fibers 11, 12, 13 with the optical connectors 11a, 12a, 13a arranged at the ends thereof can be easily held fixedly under a minimum external load by the mounting member (the tube 2 and the clamps 3) according to the invention.

In the device fabrication method according to the invention, the slit 2a is formed on the tube 2 of a material such as silicon rubber, and the cylindrical member 1 is inserted into the tube 2 through the slit 2a. The tube 2 with the cylindrical member 1 thus inserted therein is fixedly held by the clamps 3.

Figure 6:
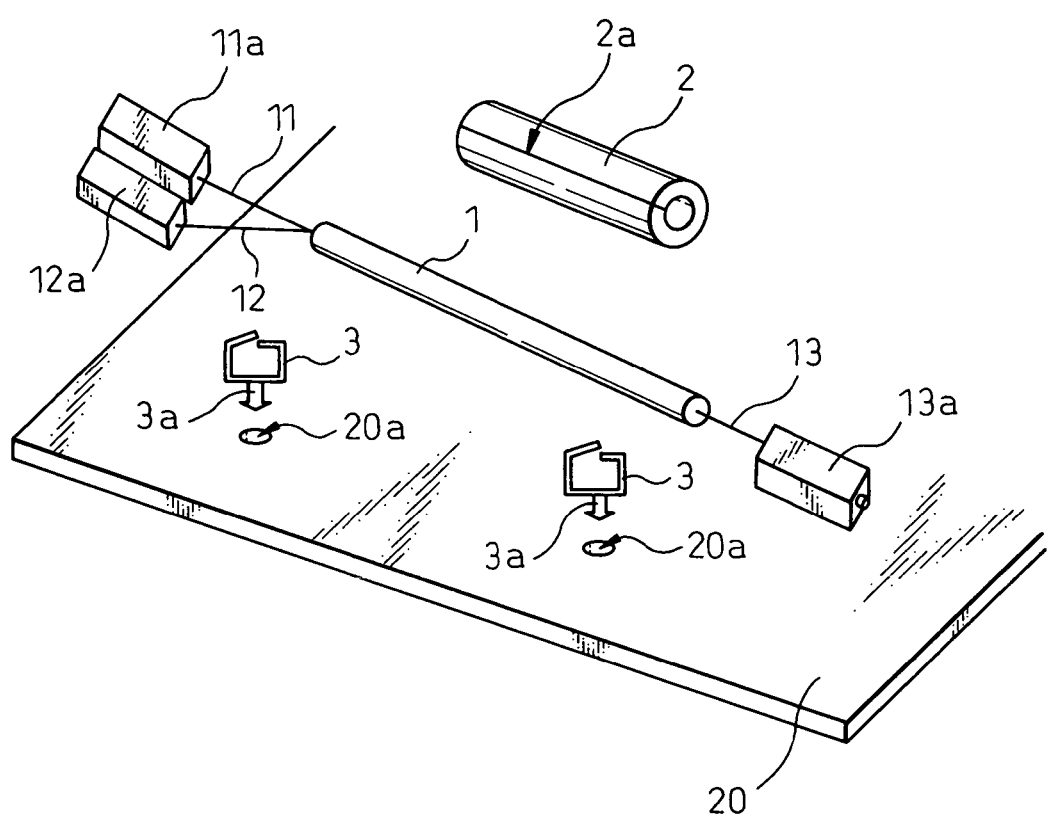
FIG. 6 is a perspective view schematically showing the device according to the invention.

FIG. 6 is a perspective view schematically showing the device according to the invention. The device according to the invention includes the cylindrical member 1, the tube 2 and the clamps 3.

An example of the method of fabricating the device according to the invention is described in detail above with reference to FIGS. 5A to 5D. The device thus fabricated is fixed by inserting the forward ends 3a of the clamps 3 into the minuscule through holes (clamp mounting holes) 20a, for example, formed on the printed wiring board 20. The device (or the cylindrical member 1 such as an optical coupler), on the other hand, is mounted on the printed wiring board 20 by inserting the forward ends 3a of the clamps 3 into the clamp mounting holes 20a as an assembly together with the cylindrical member 1. As an alternative, the forward ends 3a of the clamps 3 are inserted into the clamp mounting holes 20a to fix the clamps 3 on the printed wiring board 20 in advance, and the tube 2 with the cylindrical member 1 inserted therein is mounted on the clamps 3 fixed on the printed wiring board.

Figure 7A:
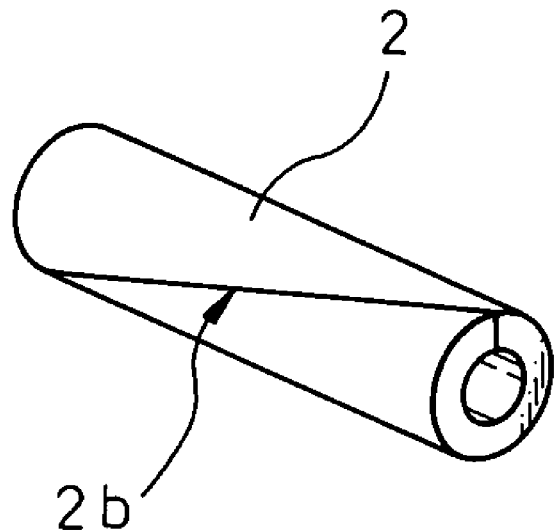
FIGS. 7A, 7B are diagrams showing other examples of the slit formed on the tube shown in FIG. 6.
Figure 7B:
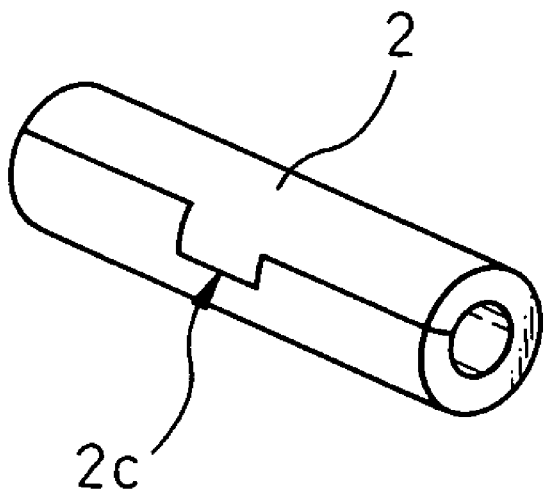

FIGS. 7A and 7B are diagrams showing other examples of the slit formed on the tube in FIG. 6.

First, as shown in FIG. 7A, the slit is formed, on the tube 2, not in parallel to the length of the tube 1 as shown in FIG. 6 but linearly at a predetermined angle with the length of the tube 1. Specifically, a slit 2b can be formed spirally. The portion of the spiral slit 2b where the cylindrical member 1 is inserted is not parallel to the length of the tube 1. Therefore, this method, though somewhat time-consuming to execute, permits the tube 1 to hold the cylindrical member 1 more firmly.

As another alternative, as shown in FIG. 7B, the slit can be formed on the tube 2 to include not only the longitudinal portion the tube as shown in FIG. 6 but also a hook-like portion 2c. By forming the hook-like portion 2c of the slit of the tube 2, the cylindrical member 2 can be held more firmly.

The slit formed on the tube 2 is not limited to the shapes described above, but can assume any of various other forms.

Figure 8A:
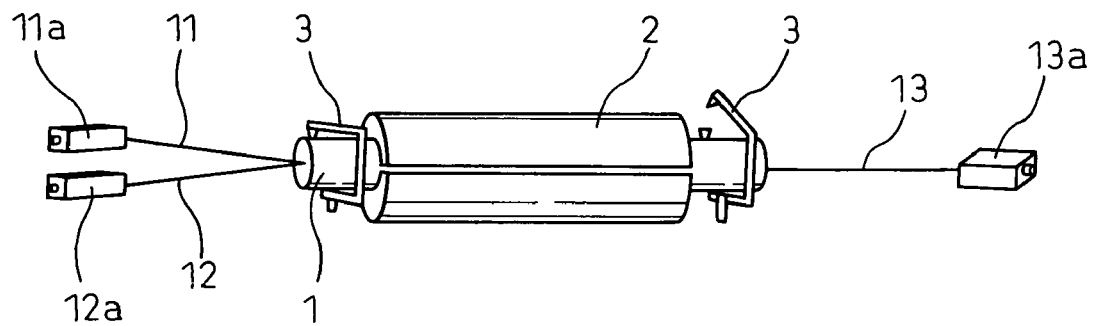
FIGS. 8A, 8B are diagrams for explaining the manner in which a cylindrical member is held by the clamps of the mounting member according to the present invention.
Figure 8B:
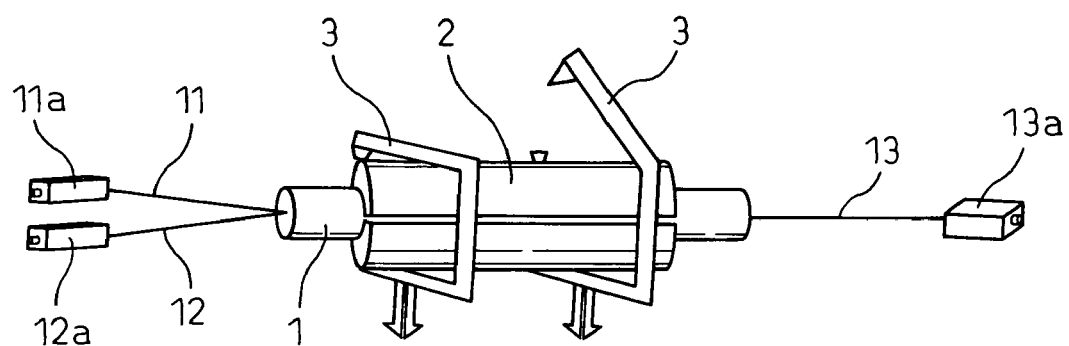

FIGS. 8A and 8B are diagrams for explaining the manner in which the cylindrical member of the mounting member is held by the clamps according to the invention.

The clamps 3 described with reference to FIG. 4, etc. are adapted to hold the outer end portions of the cylindrical member 1 exposed from the ends of the tube 2 as shown in FIG. 8A. As an alternative, the tube 2 with the cylindrical members 1 inserted therein can be held by the clamps 3 as shown in FIG. 8B.

Figure 9A:
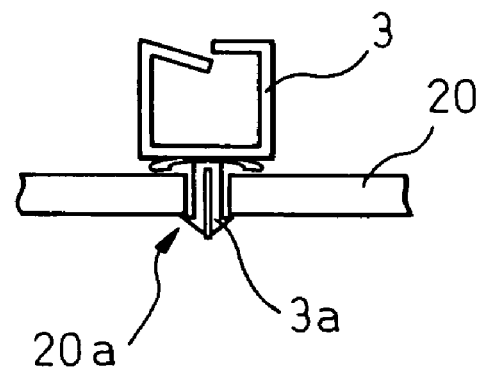
FIGS. 9A, 9B, and 9C are diagrams for explaining the manner in which the clamps of the mounting member according to the present invention are mounted on the board.
Figure 9B:
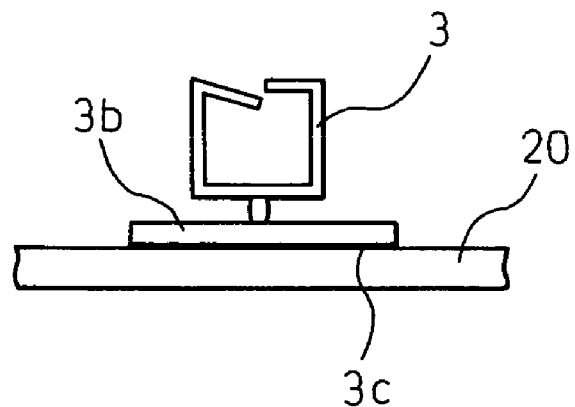
Figure 9C:
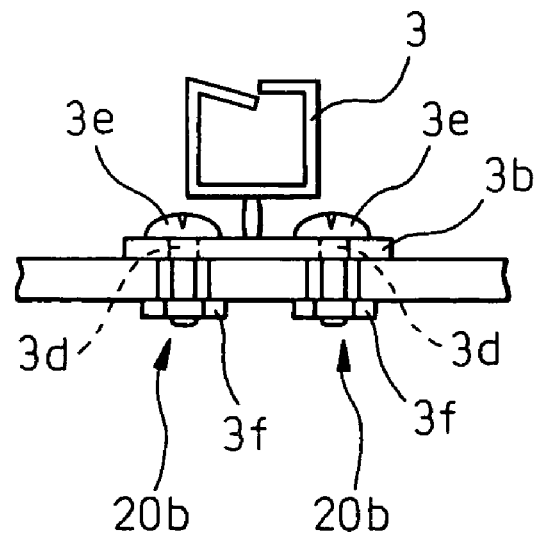

FIGS. 9A to 9C are diagrams for explaining the manner in which the clamps of the mounting member are mounted on the board according to the invention.

First, FIG. 9A shows the clamp 3 described with reference to FIG. 6, and represents a case in which the clamps 3 are each fixed on the printed wiring board 20 by inserting the protruded forward end 3a of the corresponding clamp 3 into the corresponding clamp mounting hole (minuscule through-hole) 20a formed on the printed wiring board 20.

In FIG. 9B, on the other hand, a two-side tape 3c is attached on the base portion 3b of the clamp 3, and then the clamp 3 is fixed on the printed wiring board 20 after separating the release paper of the two-side tape 3c.

Further, FIG. 9C shows a case in which the clamp 3 is fixed on the printed wiring board 20 by applying screws 3e through the mounting holes 3d of the base portion 3b and the holes 20b of the printed wiring board 20 and fastened by nuts 3f.

The optimum one of these methods of fixing the clamps 3 on the board (printed wiring board 20) is selected according to the type or the material of the surface of the board, the weight and size of the cylindrical member 1 or various other conditions. The method of mounting the clamps on the board is not, of course, limited to those described above.

As described in detail above, in mounting the cylindrical member on the printed wiring board or the like board according to the present invention, the configuration of the clamps inserted into the minuscule through holes and the tube mounted on the cylindrical member can remarkably improve the working efficiency as compared with the conventional method using the tie wraps. Also, unlike in the direct mounting method, a multiplicity of through holes are not required to be formed on the printed wiring board, and therefore the design freedom of the wiring pattern can be increased by preventing the consumption of the parts mounting area on the printed wiring board. Further, the soldering process for mounting the fittings is not required, and therefore, the management of an additional process is not required.

Further, according to the invention, the variations of the force to fasten the tie wraps from one worker to another are eliminated, and the cylindrical member can be mounted on the board more accurately, thereby obviating the problem of deformation or breakage of the cylindrical members. Also by mounting the tube of silicon rubber or the like on the cylindrical member in advance, the cylindrical member can be protected more advantageously.

As described above, according to the invention, the external load on the mounted part can be minimized while, at the same time, easily holding the mounted part fixedly on a board such as a printed wiring board.

The present invention is widely applicable not only to a case in which a cylindrical member having fibers with connectors such as an optical splitter or an optical coupler is mounted on a printed wiring board, but also to a case in which an elongate member having a rectangular or other shape of cross section is fixedly held on any of various boards (object member) including a printed wiring board.

Many different embodiments of the present invention may be constructed without departing from the scope of the present invention, and it should be understood that the present invention is not limited to the specific embodiments described in this specification, except as defined in the appended claims.

What is claimed is:

1. A mounting member holding an optical coupler or optical splitter including an optical fiber on a printed wiring board comprising:
    a tube mounting said optical coupler or optical splitter on said printed wiring board, said tube including a slit for inserting said optical coupler or optical splitter, said slit being linear at a predetermined angle, except for parallel, with a length of said tube; and
    a plurality of clamps holding said tube or outer portions on both sides of said tube, wherein said tube is adherent or flexible, an inner diameter of said tube is equal to or smaller than an outer diameter of said optical coupler or optical splitter to lap tightly around said optical coupler or optical splitter, and each of said clamps is fixed on said printed wiring board by inserting a protruded forward end of said clamp into a corresponding clamp mounting hole formed on said printed wiring board.

2. The mounting member as claimed in claim 1, wherein said clamps hold portions of said optical coupler or optical splitter on two outer sides of said tube fitted on the outside of said optical coupler or optical splitter.

3. The mounting member as claimed in claim 1, wherein said clamps hold said tube fitted on the outside of said optical coupler or optical splitter.

4. The mounting member as claimed in claim 1, wherein said tube is formed of silicon rubber.

5. The mounting member as claimed in claim 1, wherein said optical coupler or optical splitter has an optical connector at each end thereof.

6. A mounting member holding an optical coupler or optical splitter including an optical fiber on a printed wiring board comprising:
    a tube mounting said optical coupler or optical splitter on said printed wiring board, said tube including a slit for inserting said optical coupler or optical splitter, said slit being parallel to a length of said tube and including a hook-like portion; and
    a plurality of clamps fixedly holding said tube or outer portions on both sides of said tube, wherein said tube is adherent or flexible, an inner diameter of said tube is equal to or smaller than an outer diameter of said optical coupler or optical splitter to lap tightly around said optical coupler or optical splitter, and each of said clamps is fixed on said printed wiring board by inserting a protruded forward end of said clamp into a corresponding clamp mounting hole formed on said printed wiring board.

7. The mounting member as claimed in claim 6, wherein said clamps hold portions of said optical coupler or optical splitter on two outer sides of said tube fitted on the outside of said optical coupler or optical splitter.

8. The mounting member as claimed in claim 6, wherein said clamps hold said tube fitted on the outside of said optical coupler or optical splitter.

9. The mounting member as claimed in claim 6, wherein said tube is formed of silicon rubber.

10. The mounting member as claimed in claim 6, wherein said optical coupler or optical splitter has an optical connector at each end thereof.

11. A device comprising:
    an optical coupler or optical splitter including an optical fiber;
    a tube mounting said optical coupler or optical splitter on said printed wiring board, said tube including a slit for inserting said optical coupler or optical splitter, said slit being linear at a predetermined angle, except for parallel, with a length of said tube; and
    a plurality of clamps holding said tube or outer portions on both sides of said tube, wherein said tube is adherent or flexible, an inner diameter of said tube is equal to or smaller than an outer diameter of said optical coupler or optical splitter to lap tightly around said optical coupler or optical splitter, and each of said clamps is fixed on said printed wiring board by inserting a protruded forward end of said clamp into a corresponding clamp mounting hole formed on said printed wiring board.

12. A device comprising:
an optical coupler or optical splitter with an optical fiber extending from each end thereof;
a tube mounting said optical coupler or optical splitter on said printed wiring board, said tube including a slit for inserting said optical coupler or optical splitter, said slit being parallel to a length of said tube and including a hook-like portion; and
a plurality of clamps holding said tube or outer portions on both sides of said tube, wherein said tube is adherent or flexible, an inner diameter of said tube is equal to or smaller than an outer diameter of said optical coupler or optical splitter to lap tightly around said optical coupler or optical splitter, and each of said clamps is fixed on said printed wiring board by inserting a protruded forward end of said clamp into a corresponding clamp mounting hole formed on said printed wiring board.

13. A method of mounting an optical coupler or optical splitter including an optical fiber, comprising:
preparing a tube including a slit for inserting said optical coupler or optical splitter, said slit being linear at a predetermined angle, except for parallel, with a length of said tube;
inserting said optical coupler or optical splitter including an optical fiber into said tube through said slit; and
holding by clamps said tube with said optical coupler or optical splitter inserted therein on a printed wiring board, wherein said tube is adherent or flexible, an inner diameter of said tube is equal to or smaller than an outer diameter of said optical coupler or optical splitter to lap tightly around said optical coupler or optical splitter, and each of said clamps is fixed on said printed wiring board by inserting a protruded forward end of said clamp into a corresponding clamp mounting hole formed on said printed wiring board.

14. The method as claimed in claim 13, wherein said clamps hold portions of said optical coupler or optical splitter on two outer sides of said tube fitted on an outside of said optical coupler or optical splitter.

15. The method as claimed in claim 13, wherein said clamps hold said tube fitted on an outside of said optical coupler or optical splitter.

16. The method as claimed in claim 13, wherein said tube is formed of silicon rubber.

17. The method as claimed in claim 13, wherein said optical coupler or optical splitter has an optical connector at each end thereof.

18. A method of mounting an optical coupler or optical splitter including an optical fiber, comprising:
preparing a tube including a slit for inserting said optical coupler or optical splitter, said slit being parallel to a length of said tube and including a hook-like portion;
inserting said optical coupler or optical splitter into said tube through said slit; and
holding by clamps said tube with said optical coupler or optical splitter inserted therein on a printed wiring board, wherein said tube is adherent or flexible, an inner diameter of said tube is equal to or smaller than an outer diameter of said optical coupler or optical splitter to lap tightly around said optical coupler or optical splitter, and each of said clamps is fixed on said printed wiring board by inserting a protruded forward end of said clamp into a corresponding clamp mounting hole formed on said printed wiring board.

19. The method as claimed in claim 18, wherein said clamps hold portions of said optical coupler or optical splitter part on two outer sides of said tube fitted on the outside of said optical coupler or optical splitter.

20. The method as claimed in claim 18, wherein said clamps hold said tube fitted on the outside of said optical coupler or optical splitter.

21. The method as claimed in claim 18, wherein said tube is formed of silicon rubber.

22. The method as claimed in claim 18, wherein said optical coupler or optical splitter has an optical connector at each end thereof.

* * * * *